US010879044B2

United States Patent
Wang et al.

(10) Patent No.: US 10,879,044 B2
(45) Date of Patent: Dec. 29, 2020

(54) AUXILIARY CIRCUIT IN RF MATCHING NETWORK FOR FREQUENCY TUNING ASSISTED DUAL-LEVEL PULSING

(71) Applicant: LAM RESEARCH CORPORATION, Fremont, CA (US)

(72) Inventors: Yuhou Wang, Fremont, CA (US); Arthur H. Sato, San Jose, CA (US); Ying Wu, Livermore, CA (US); Alexander Miller Paterson, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 39 days.

(21) Appl. No.: 15/942,629

(22) Filed: Apr. 2, 2018

(65) Prior Publication Data
US 2018/0294566 A1 Oct. 11, 2018

Related U.S. Application Data

(60) Provisional application No. 62/482,859, filed on Apr. 7, 2017.

(51) Int. Cl.
*H01J 37/32* (2006.01)
(52) U.S. Cl.
CPC .............................. *H01J 37/32183* (2013.01)
(58) Field of Classification Search
None
See application file for complete search history.

(56) References Cited

U.S. PATENT DOCUMENTS

| | | | |
|---|---|---|---|
| 7,879,185 B2* | 2/2011 | Shannon | H01J 37/32183 156/345.44 |
| 8,264,154 B2* | 9/2012 | Banner | H01J 37/32155 315/111.71 |
| 8,581,597 B2* | 11/2013 | Coumou | G06F 19/00 324/536 |

(Continued)

FOREIGN PATENT DOCUMENTS

| | | |
|---|---|---|
| CN | 103021774 A | 4/2013 |
| KR | 10-1328520 B1 | 11/2013 |

OTHER PUBLICATIONS

International Search Report and Written Opinion dated Jul. 27, 2018 corresponding to International application No. PCT/US2018/025838, 12 pages.

*Primary Examiner* — Amy Cohen Johnson
*Assistant Examiner* — Srinivas Sathiraju

(57) ABSTRACT

A radio frequency (RF) matching circuit control system includes an RF matching circuit including a plurality of tunable components. The RF matching circuit is configured to receive an input signal including at least two pulsing levels from an RF generator, provide an output signal to a load based on the input signal, and match an impedance associated with the input signal to impedances of the load. A controller is configured to determine respective impedances of the load for the at least two pulsing levels of the input signal and adjust operating parameters of the plurality of tunable components to align a frequency tuning range of the RF matching circuit with the respective impedances of the load for the at least two pulsing levels to match the impedance associated with the input signal to the respective impedances.

15 Claims, 10 Drawing Sheets

(56) References Cited

U.S. PATENT DOCUMENTS

| | | | |
|---|---|---|---|
| 8,773,019 B2* | 7/2014 | Coumou | H03F 1/56 |
| | | | 315/111.21 |
| 9,088,267 B2* | 7/2015 | Blackburn | H05H 1/24 |
| 9,136,094 B2* | 9/2015 | Cho | H01L 21/67069 |
| 9,378,931 B2* | 6/2016 | Kwon | H01J 37/32091 |
| 9,508,529 B2* | 11/2016 | Valcore, Jr. | H01J 37/32174 |
| 9,614,524 B1* | 4/2017 | Kawasaki | H01J 37/32165 |
| 9,754,767 B2* | 9/2017 | Kawasaki | H01J 37/32146 |
| 9,788,405 B2* | 10/2017 | Kawasaki | H01J 37/32174 |
| 9,839,109 B1* | 12/2017 | Leray | H05H 1/46 |
| 10,009,028 B2* | 6/2018 | Wu | H03K 19/00384 |
| 10,229,816 B2* | 3/2019 | Coumou | H03F 1/3223 |
| 10,325,759 B2* | 6/2019 | Valcore, Jr. | H01J 37/32119 |
| 10,340,915 B2* | 7/2019 | Wu | H03K 19/00384 |
| 10,410,836 B2* | 9/2019 | McChesney | H01J 37/32183 |
| 2002/0025685 A1 | 2/2002 | Huang et al. | |
| 2003/0098127 A1* | 5/2003 | Nakano | H01J 37/32082 |
| | | | 156/345.44 |
| 2005/0133163 A1 | 6/2005 | Shannon et al. | |
| 2009/0284156 A1* | 11/2009 | Banna | H01J 37/32174 |
| | | | 315/111.21 |
| 2013/0105086 A1* | 5/2013 | Banna | H05H 1/46 |
| | | | 156/345.38 |
| 2013/0214683 A1* | 8/2013 | Valcore, Jr. | H01J 37/32146 |
| | | | 315/111.21 |
| 2017/0103873 A1* | 4/2017 | Kawasaki | H01J 37/3299 |
| 2017/0345620 A1* | 11/2017 | Coumou | H01J 37/32183 |
| 2018/0097520 A1* | 4/2018 | Wu | H03K 19/00384 |
| 2018/0261430 A1* | 9/2018 | Kawasaki | H01J 37/32935 |
| 2018/0262196 A1* | 9/2018 | Wu | H03K 19/00384 |
| 2018/0294566 A1* | 10/2018 | Wang | H01Q 5/335 |
| 2019/0304753 A1* | 10/2019 | Leray | H02J 50/20 |

* cited by examiner

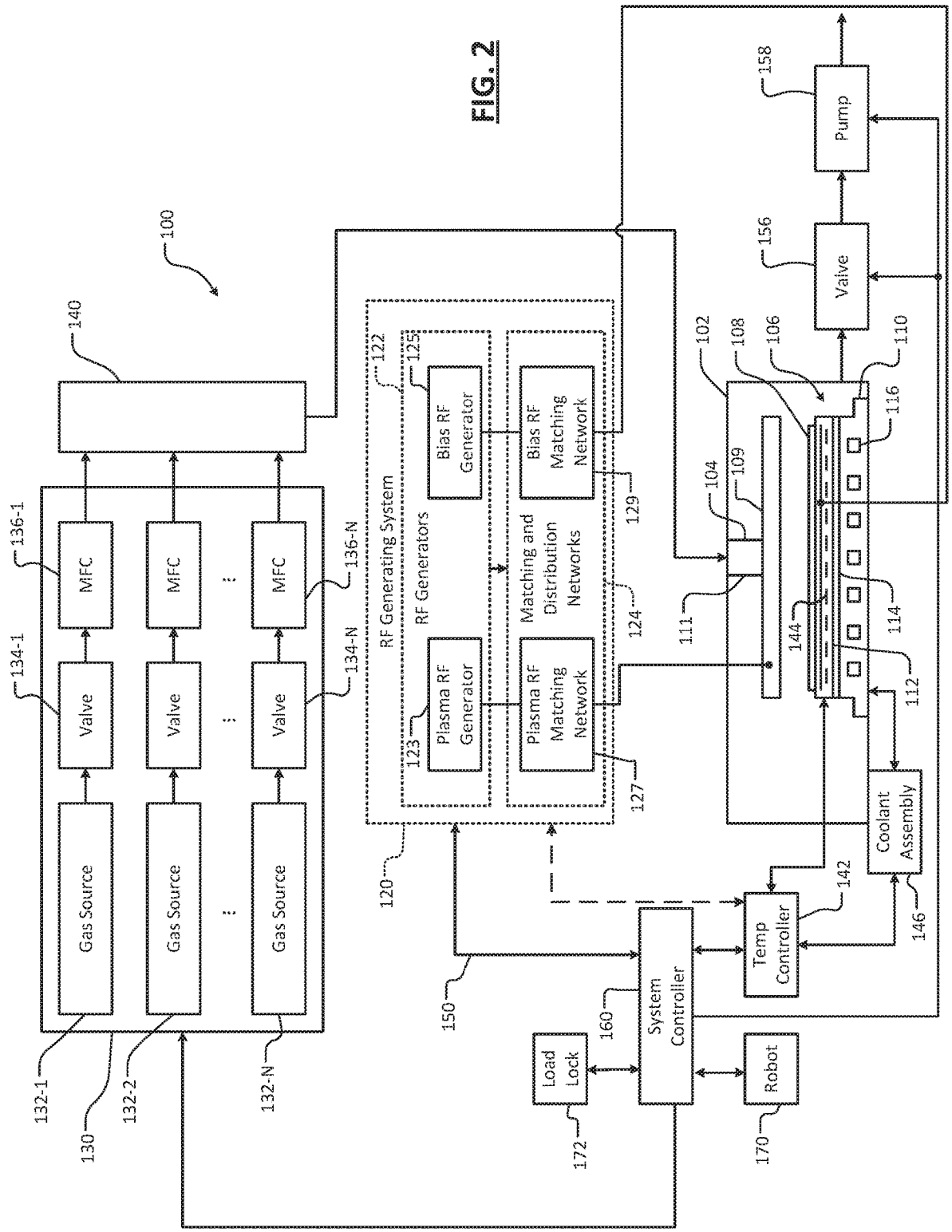

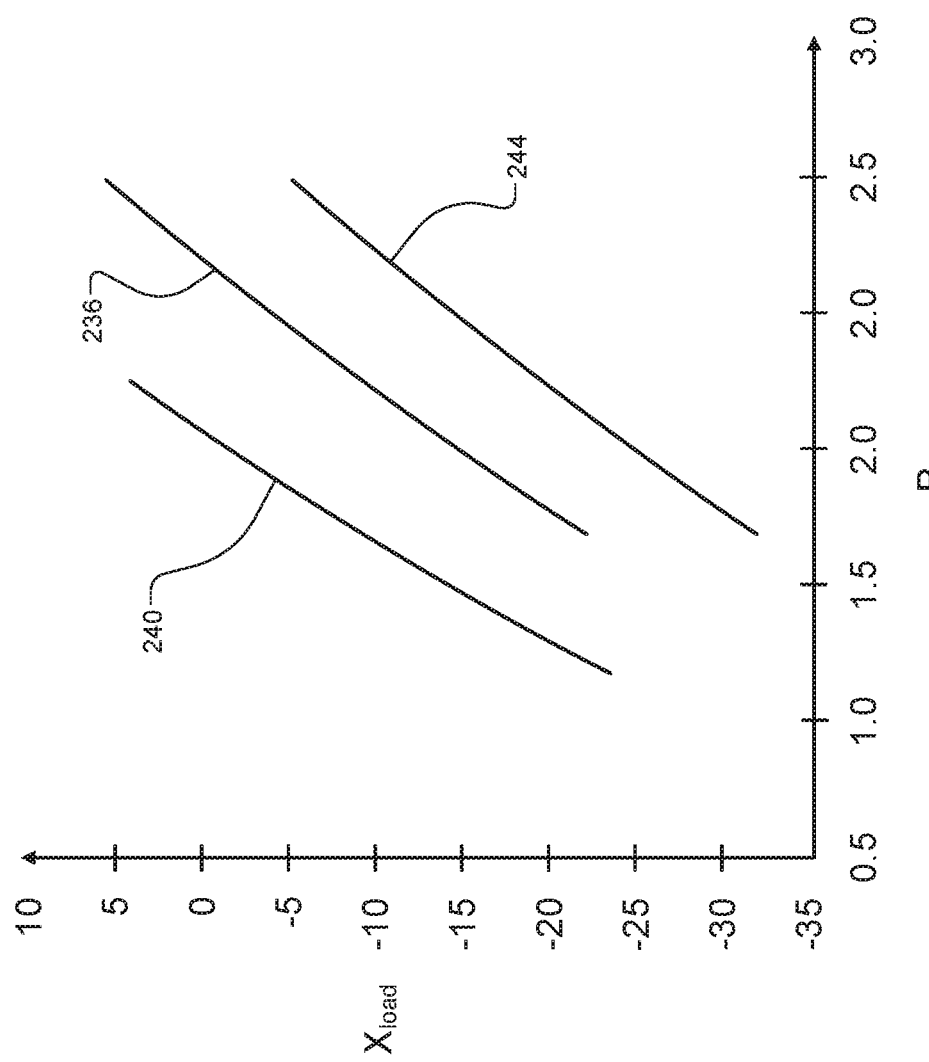

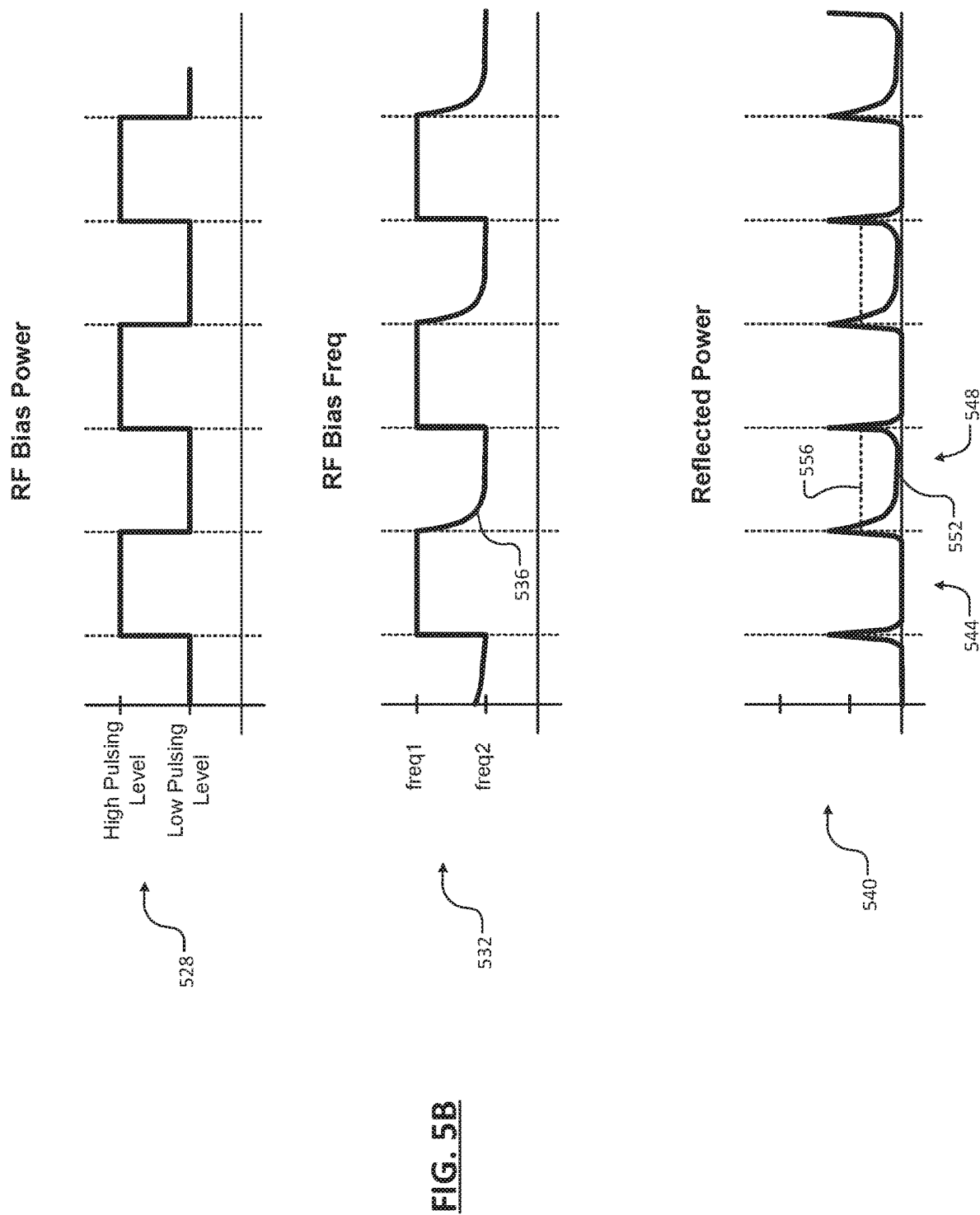

AUXILIARY CIRCUIT IN RF MATCHING NETWORK FOR FREQUENCY TUNING ASSISTED DUAL-LEVEL PULSING

CROSS-REFERENCE TO RELATED APPLICATIONS

This application claims the benefit of U.S. Provisional Application No. 62/482,859, filed on Apr. 7, 2017. The entire disclosure of the application referenced above is incorporated herein by reference.

FIELD

The present disclosure relates to pulsed plasma operation in substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, and/or other treatment of substrates such as semiconductor wafers. Example processes that may be performed on a substrate include, but are not limited to, a plasma enhanced chemical vapor deposition (PECVD) process, a chemically enhanced plasma vapor deposition (CEPVD) process, an ion implantation process, and/or other etch, deposition, and cleaning processes. A substrate may be arranged on a substrate support such as a pedestal, an electrostatic chuck (ESC), etc. in a processing chamber of the substrate processing system. For example, during etching in a PECVD process, a gas mixture including one or more precursors is introduced into the processing chamber and plasma is struck to etch the substrate.

SUMMARY

A radio frequency (RF) matching circuit control system includes an RF matching circuit including a plurality of tunable components. The RF matching circuit is configured to receive an input signal including at least two pulsing levels from an RF generator, provide an output signal to a load based on the input signal, and match an impedance associated with the input signal to impedances of the load. A controller is configured to determine respective impedances of the load for the at least two pulsing levels of the input signal and adjust operating parameters of the plurality of tunable components to align a frequency tuning range of the RF matching circuit with the respective impedances of the load for the at least two pulsing levels to match the impedance associated with the input signal to the respective impedances.

In other features, the operating parameters include a first operating parameter corresponding to at least one of a first capacitance of a first capacitor and a second capacitance of a second capacitor of the RF matching circuit and a second operating parameter corresponding to a third capacitance of a third capacitor. The first capacitor corresponds to a shunt capacitor connected between the input signal and ground. The second capacitor corresponds to a series capacitor connected between the input signal and the load. The third capacitor is connected between (i) an end of the second capacitor connected to the load and (ii) ground. The operating parameters further include a third operating parameter corresponding to an inductance value of an inductor. The inductor is connected in parallel with the third capacitor.

In other features, adjusting the first operating parameter shifts the tunable frequency range in a translational direction. Adjusting the second operating parameter shifts the tunable frequency range in a rotational direction. To adjust the first operating parameter, the controller is configured to determine respective values of the first capacitance and the second capacitance to reduce a reflected power associated with the impedance of the load for a first pulsing level of the at least two pulsing levels and adjust at least one of the first capacitor and the second capacitor based on the determined respective values. To adjust the second operating parameter, the controller is configured to determine a value of the third capacitance to reduce a reflected power associated with the impedance of the load for a second pulsing level of the at least two pulsing levels and adjust the third capacitor to the determined value of the third capacitance.

In other features, a substrate processing system includes the RF matching circuit. The load corresponds to at least one of an electrode, an inductive coil structure, and plasma within a substrate processing chamber.

A method for performing impedance matching in a substrate processing system includes, using an RF matching circuit including a plurality of tunable components, receiving an input signal including at least two pulsing levels from an RF generator, providing an output signal to a load based on the input signal, and matching an impedance associated with the input signal to impedances of the load. The method further includes determining respective impedances of the load for the at least two pulsing levels of the input signal and adjusting operating parameters of the plurality of tunable components to align a frequency tuning range of the RF matching circuit with the respective impedances of the load for the at least two pulsing levels to match the impedance associated with the input signal to the respective impedances.

In other features, the operating parameters include a first operating parameter corresponding to at least one of a first capacitance of a first capacitor and a second capacitance of a second capacitor of the RF matching circuit and a second operating parameter corresponding to a third capacitance of a third capacitor. The first capacitor corresponds to a shunt capacitor connected between the input signal and ground. The second capacitor corresponds to a series capacitor connected between the input signal and the load. The third capacitor is connected between an end of the second capacitor connected to the load and ground. An inductor is connected in parallel with the third capacitor. Adjusting the first operating parameter shifts the tunable frequency range in a translational direction. Adjusting the second operating parameter shifts the tunable frequency range in a rotational direction.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 2 is a functional block diagram of an example of another substrate processing system incorporating a temperature controller according to the principles of the present disclosure;

FIG. 3D shows example frequency tuning ranges for different capacitances of the matching circuit of FIG. 3A;

FIG. 5B shows reflected power for high and low pulsing levels according to the principles of the present disclosure.

In the drawings, reference numbers may be reused to identify similar and/or identical elements.

DETAILED DESCRIPTION

Substrate processing systems may include a matching circuit or network for matching an impedance of a radio frequency (RF) power source to, for example, an electrode (in a capacitively coupled plasma, or CCP, system), an inductive coil structure (in an inductively coupled plasma, or ICP, system), etc. For example, the matching circuit may correspond to a bias matching circuit, an RF matching network, etc. The matching circuit may be tuned to minimize power reflection associated with a particular power level provided by the RF power source. Some substrate processing systems implement dual-level (and/or other mixed mode) plasma pulsing. In dual-level pulsing, an output of the RF power source alternates between two pulsing levels (e.g., a high pulsing level and a low pulsing level). Accordingly, the matching circuit may be tuned to only one of the two levels. In some examples, the matching circuit may include variable capacitors for retuning the matching circuit according to the power level. However, mechanisms for adjusting the capacitors are typically slower than a duration of an RF pulse in dual-level pulsing. In other examples, a frequency of the RF power source is adjusted to minimize power reflection when the matching circuit is not tuned for a particular pulsing level, which may be referred to as frequency tuning. However, frequency tuning may not adequately minimize power reflection for the particular pulsing level.

Accordingly, current techniques do not eliminate power reflection (and therefore ensure full power delivery) for both pulsing levels in dual-level pulsing operation. A matching circuit for dual-level pulsing systems according to the principles of the present disclosure implements a tunable auxiliary circuit to substantially reduce or eliminate reflected power in both pulsing levels. Although described with respect to dual-level pulsing, the principles of the present disclosure may also be implemented in single and/or multi-level (i.e. three or more pulsing levels) pulsing systems.

Figure 1:
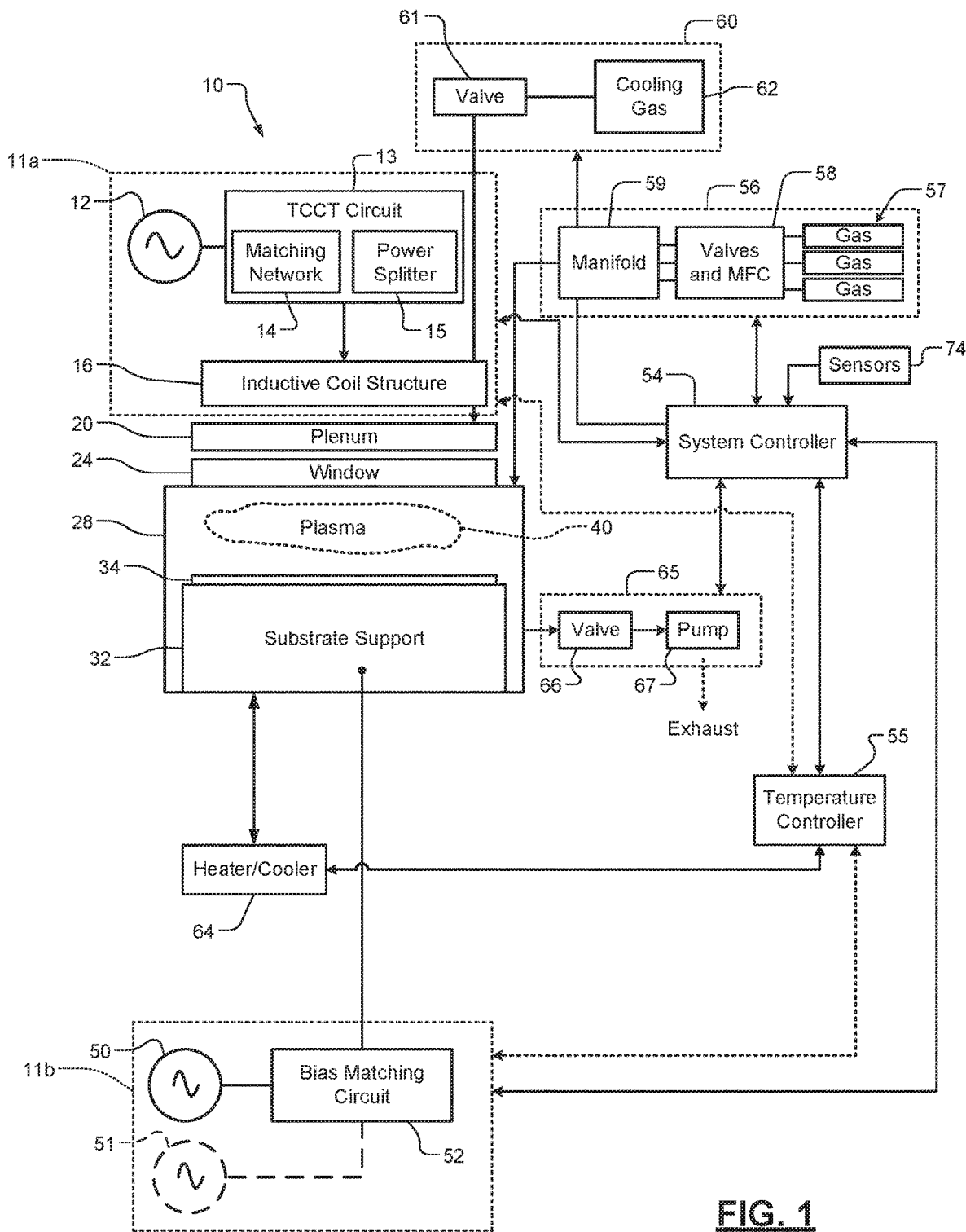
FIG. 1 is a functional block diagram of an example of a substrate processing system incorporating a temperature controller according to the principles of the present disclosure.

Referring now to FIG. 1, an example of a substrate processing system 10 is shown. The substrate processing system 10 includes RF generating systems 11a, 11b. In some examples, the RF generating system 11a includes an RF source 12 (e.g., a transformer coupled plasma (TCP) RF generator) connected to a transformer coupled capacitive tuning (TCCT) circuit 13, which outputs current to an inductive coil structure 16.

The TCCT circuit 13 typically includes a matching network 14 and a power splitter 15. The matching network 14 may be connected by a transmission line to the RF source 12. The matching network 14 matches an impedance of the RF source 12 to the rest of the circuit 13 including the power splitter 15 and the inductive coil structure 16. In some examples, the inductive coil structure 16 may include a single inductive coil, a pair of inductive coils, or an inner inductive coil pair and an outer inductive coil pair. The power splitter 15 may be used to control the relative amount of inductive current supplied to coils of the inductive coil structure 16. While flat coils are shown, other types of coils may be used.

A gas plenum 20 may be arranged between the inductive coil structure 16 and a dielectric window 24. The dielectric window 24 is arranged along one side of a processing chamber 28. The processing chamber 28 further comprises a substrate support 32 that supports a substrate 34. The substrate support 32 may include an electrostatic chuck, a mechanical chuck or other type of chuck. Plasma 40 is generated inside of the processing chamber 28. The plasma 40 may be used to deposit film or to etch the substrate 34.

The RF generating system 11b may include one or more bias RF sources 50, 51 and a bias matching circuit 52. The RF source 50 provides a bias RF voltage to bias the substrate support 32 during operation. The bias matching circuit 52 matches an impedance of the RF sources 50, 51 to the substrate support 32.

The RF generating systems 11a, 11b may be referred to collectively as a RF generating system 11 and are controlled by a system controller 54. One or more of the bias matching circuit 52 and the matching network 14 may implement an auxiliary matching circuit for dual-level (and/or other mixed-mode) pulsing systems and methods according to the principles of the present disclosure, as described below in more detail.

A gas delivery system 56 may be used to supply a gas mixture to the processing chamber 28 adjacent to the dielectric window 24. The gas delivery system 56 may include process gas sources 57, a metering system 58 such as valves and mass flow controllers, and a manifold 59 to mix the process gases.

A gas delivery system 60 may be used to deliver gas 62 via a valve 61 to the gas plenum 20. The gas may include cooling gas that is used to cool the inductive coil structure 16 and the dielectric window 24. A heater 64 may be used to heat the substrate support 32 to a predetermined temperature. An exhaust system 65 includes a valve 66 and pump 67 to remove reactants from the processing chamber 28 by purging or evacuation.

The system controller 54 may be used to control the etching process. The system controller 54 monitors process parameters such as temperature, pressure, etc. and controls delivery of the gas mixture, striking, maintaining and extinguishing the plasma, removal of reactants, supply of cooling gas, etc. A temperature controller 55 controls temperature of the substrate support 32.

The system controller 54 may receive input signals from sensors 74 and based on the input signals control operation of the RF sources 12, 50, 51, the bias matching circuit 52, and the heater/cooler 64 and/or components of the substrate processing system 10. The sensors 74 may be located in the RF generating systems 11a, 11b, in the chamber 28, in the substrate support 32, or elsewhere in the substrate processing system 10. The sensors 74 detect, for example, supplied RF voltages, temperatures, gas and/or coolant flow rates, and gas and/or coolant pressures.

Referring now to FIG. 2, an example substrate processing system 100 for performing etching using RF plasma is shown. The substrate processing system 100 includes a processing chamber 102. The processing chamber 102 encloses other components of the processing chamber 102 and contains the RF plasma. The processing chamber 102 includes an upper electrode 104 and a substrate support 106 (e.g., an ESC). During operation, a substrate 108 is arranged on the substrate support 106.

For example only, the upper electrode 104 may include a showerhead 109 that introduces and distributes gases. The showerhead 109 may include a stem portion 111 including one end connected to a top surface of the processing chamber 102. The showerhead 109 is generally cylindrical and extends radially outwardly from an opposite end of the stem portion 111 at a location that is spaced from the top surface of the processing chamber 102. A substrate-facing surface or the showerhead 109 includes holes through which process or purge gas flows. Alternately, the upper electrode 104 may include a conducting plate and the gases may be introduced in another manner.

The substrate support 106 includes a conductive baseplate 110 that acts as a lower electrode. The baseplate 110 supports a heating plate 112, which may be formed at least partially of a ceramic material. A thermal resistance layer 114 may be arranged between the heating plate 112 and the baseplate 110. The baseplate 110 may include one or more coolant channels 116 for flowing coolant through the baseplate 110.

An RF generating system 120 generates and outputs an RF voltage to one of the upper electrode 104 and the lower electrode (e.g., the baseplate 110 of the substrate support 106). The other one of the upper electrode 104 and the baseplate 110 may be DC grounded, AC grounded or at a floating potential. For example only, the RF generating system 120 may include one or more RF generators 122 (e.g., a capacitive coupled plasma RF power generator, a bias RF power generator, and/or other RF power generator) that generate RF voltages, which are fed by one or more matching and distribution networks 124 to the upper electrode 104 and/or the baseplate 110. As an example, a plasma RF generator 123, a bias RF generator 125, a plasma RF matching network 127 and a bias RF matching network 129 are shown. One or more of the bias RF matching network 129 and the plasma RF matching network 127 may implement an auxiliary matching circuit for dual-level (and/or other mixed-mode) pulsing systems and methods according to the principles of the present disclosure, as described below in more detail.

A gas delivery system 130 includes one or more gas sources 132-1, 132-2, . . . , and 132-N (collectively gas sources 132), where N is an integer greater than zero. The gas sources 132 supply one or more precursors and mixtures thereof. The gas sources 132 may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to thermal control elements (TCEs) 144 arranged in the heating plate 112. Although shown separately from a system controller 160, the temperature controller 142 may be implemented as part of the system controller 160. The temperature controller 142 may control operation and thus temperatures of the TCEs 144 to control temperatures of the substrate support 106 and a substrate (e.g., the substrate 108) on the substrate support 106. The temperature controller 142 may communicate with a coolant assembly 146 to control coolant flow (pressures and flow rates) through the channels 116. For example, the coolant assembly 146 may include a coolant pump and reservoir. The temperature controller 142 operates the coolant assembly 146 to selectively flow the coolant through the channels 116 to cool the substrate support 106 and the heating plate 112. The temperature controller 142 may control the rate at which the coolant flows and a temperature of the coolant. The temperature controller 142 controls current supplied to the TCEs 144 and pressure and flow rates of coolant supplied to channels 116 based on detected parameters as further described below.

A valve 156 and pump 158 may be used to evacuate reactants from the processing chamber 102. The system controller 160 may control components of the substrate processing system 100 including controlling supplied RF power levels, pressures and flow rates of supplied gases, RF matching, etc. The system controller 160 controls states of the valve 156 and the pump 158. A robot 170 may be used to deliver substrates onto, and remove substrates from, the substrate support 106. For example, the robot 170 may transfer substrates between the substrate support 106 and a load lock 172. The robot 170 may be controlled by the system controller 160. The system controller 160 may control operation of the load lock 172.

Referring now to FIGS. 3A, 3B, 3C, 3D, an example matching circuit 200 (e.g., corresponding to the bias matching circuit 52, the RF bias matching network 129, etc.) tuned to one pulsing level is described. The matching circuit 200 includes capacitors C1 and C3, which may be referred to as a shunt capacitor and a series capacitor, respectively. The matching circuit 200 is connected between an RF power generator and an electrode and is tuned to provide impedance matching for RF power provided to the electrode. For examples, the capacitors C1 and C3 are variable capacitors that are adjusted to match an impedance of relevant components of a substrate processing system (e.g., coils, plasma, etc.).

Figure 3B:
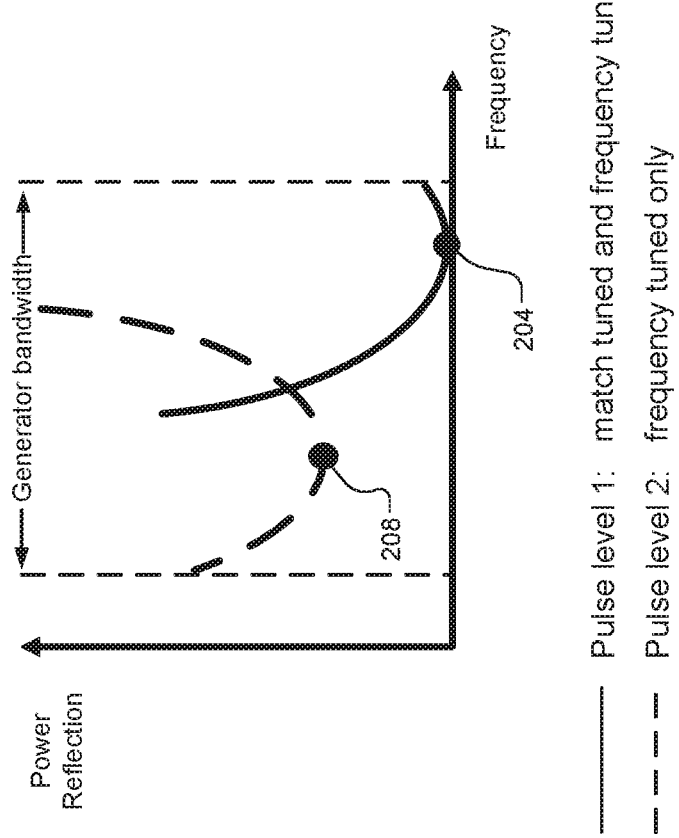
FIG. 3B shows example tuning ranges of the matching circuit of FIG. 3A for different pulsing levels.
Figure 3A:
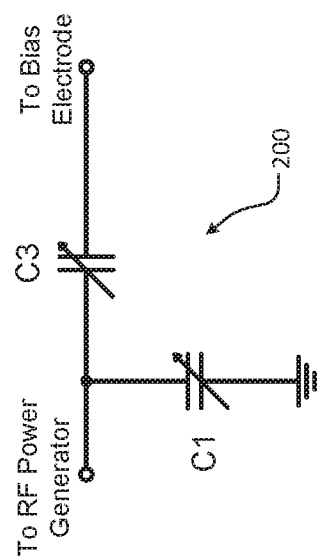
FIG. 3A shows an example matching circuit.

As shown in FIG. 3B (which illustrates power reflection vs. frequency of an RF source, such as the RF source 12, 50, 51, etc.), the matching circuit 200 may be tuned to match an impedance associated with a first pulsing level 204. Accordingly, when combined with frequency tuning, power reflection may be eliminated (e.g., reduced to 0%) at the first pulsing level 204. In other words, the capacitances of the capacitors C1 and/or C3 may be adjusted ("match tuned") in addition to adjusting the frequency ("frequency tuned"). Frequency tuning may be constrained by a generator bandwidth (i.e., a frequency bandwidth of the RF power generator). Conversely, since the matching circuit 200 is not tuned to match an impedance associated with a second pulsing level 208 (i.e., the capacitances C1 and C3 are not match tuned to the second pulsing level 208), 0% power reflection may not be achievable at the second pulsing level 208 even with frequency tuning.

Figure 3C:
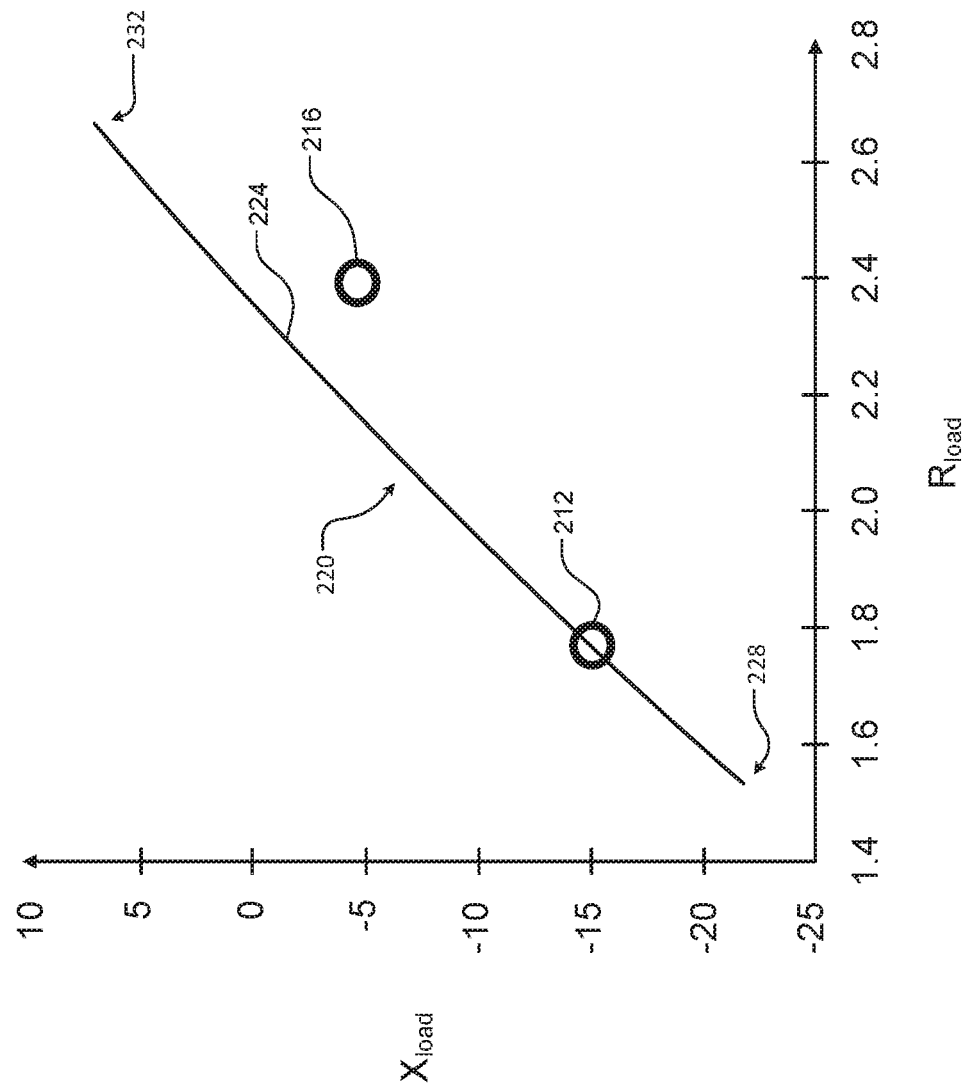
FIG. 3C shows an example frequency tuning range of the matching circuit of FIG. 3A for different impedances.

As shown in FIG. 3C, an impedance of a load (e.g., $Z_{load}$) associated with a first pulsing level (S1) is shown at 212. For example, the load impedance is 50 Ohms. Conversely, an impedance associated with a second pulsing level (S2) is shown at 216. The impedances 212 and 216 are shown relative to a complex representation of the load impedance $Z_{load}$ (e.g., where $Z_{load}=R_{load}+j*X_{load}$, $R_{load}$ corresponds to load resistance, $X_{load}$ corresponds to load reactance, and $j^2=-1$). A tunable impedance range (e.g., for frequency tuning) of the matching circuit 200 for various load values is shown at 220. Accordingly, the matching circuit 200 is tuned (e.g., values of the capacitors C1 and C3 are adjusted) such that the impedance 212 is aligned with the tunable impedance range 220. In this manner, when combined with frequency tuning, power reflection for the first pulsing level S1 can be eliminated. However, for the second pulsing level S2, frequency tuning may at best achieve an impedance as shown at 224, which is not equivalent to the impedance 216. For example, as shown, the frequency may be varied between 12.80 MHz (at 228) to 14.20 MHz (at 232). The tuned frequency for the first pulsing level may correspond to 13.80 MHz. Conversely, the frequency at 224 may correspond to 13.15 MHz.

As shown in FIG. 3D, an example tunable impedance range 236 for the matching circuit 200 is shown. Varying the capacitors C1 and C3 may adjust the tunable impedance range. For example, increasing the capacitance of C1 may result in a shift of the tunable impedance range from 236 to 240. Conversely, increasing the capacitance of C3 may result in a shift of the tunable impedance range from 236 to 244. Accordingly, varying the capacitors C1 and C3 may shift the tunable impedance range 236 in a generally translational manner. However, if the impedances associated with the first pulsing level and the second pulsing level are not aligned with a same one of the frequency tunable impedance ranges, power reflection may not be eliminated for both pulsing levels.

Figure 4C:
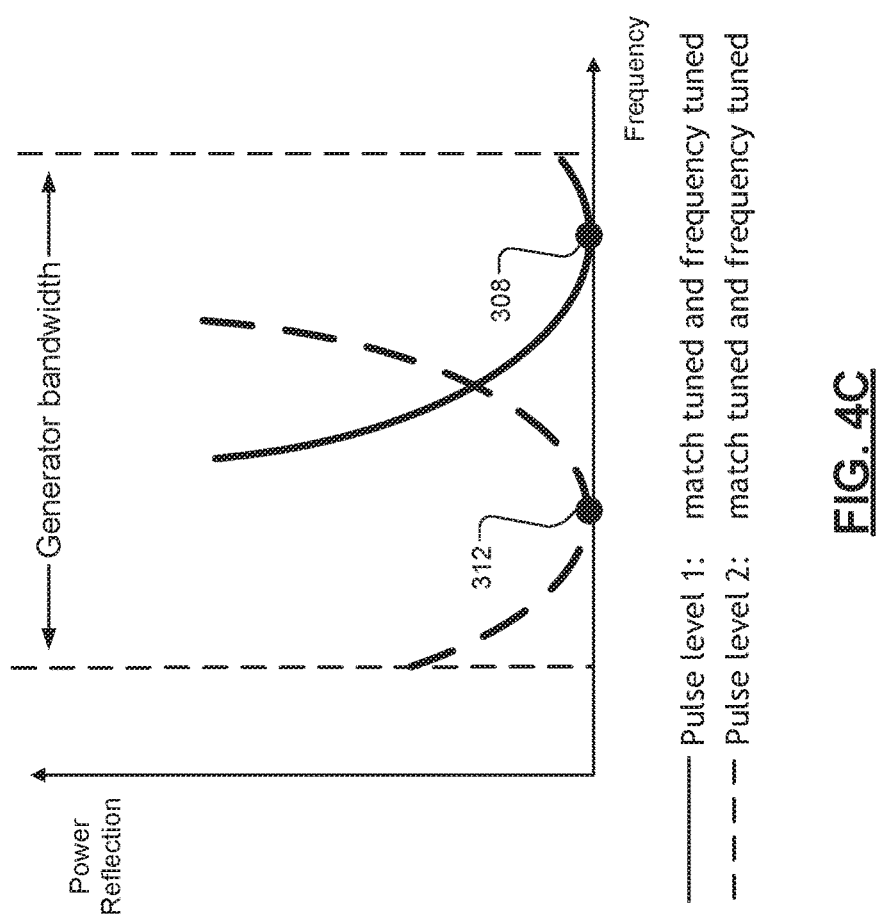
FIG. 4C shows example tuning ranges of the matching circuits of FIGS. 4A and 4B for different pulsing levels.
Figure 4A:
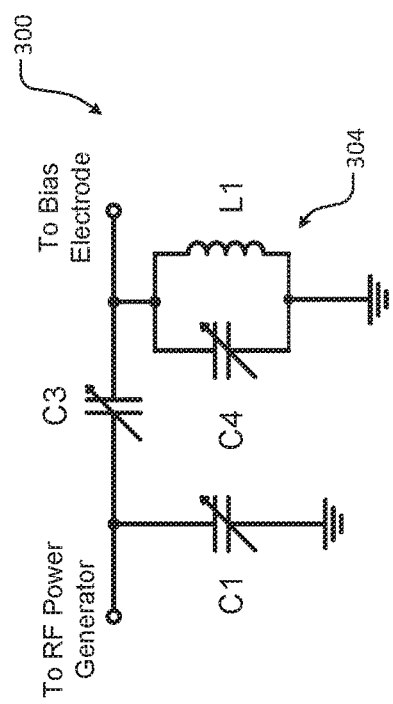
FIG. 4A shows a first example matching circuit according to the principles of the present disclosure.
Figure 4B:
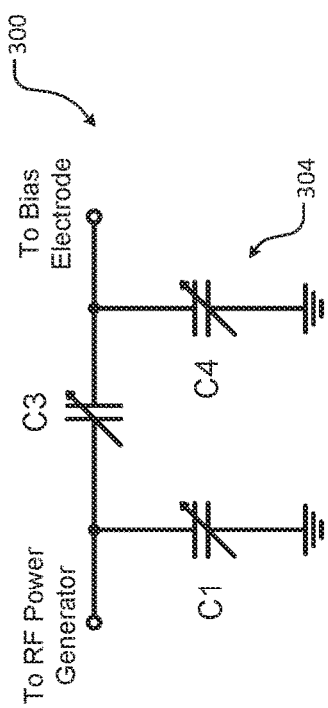
FIG. 4B shows a second example matching circuit according to the principles of the present disclosure.

Referring now to FIGS. 4A, 4B, and 4C, and 4D, an example matching circuit 300 tuned to both pulsing levels according to the principles of the present disclosure is described. The matching circuit 300 includes capacitors C1 and C3. The matching circuit 300 is connected between an RF power generator and, for example, an electrode (in a CCP system), an inductive coil structure (in an ICP system), etc., and is tuned to provide impedance matching for RF power provided to the electrode or ICP coil. The matching circuit 300 further includes an auxiliary matching circuit 304 connected at an output of the matching circuit 300. In one example, the auxiliary matching circuit 304 includes a capacitor C4 and an inductor L1 connected in parallel (e.g., an LC circuit) as shown in FIG. 4A. In another example, the auxiliary matching circuit 304 includes the capacitor C4 as shown in FIG. 4B.

As shown in FIG. 4C, the matching circuit 300 may be tuned to match an impedance associated with each of a first pulsing level 308 and a second pulsing level 312. Accordingly, when combined with frequency tuning, power reflection may be eliminated at the first pulsing level 308 and eliminated at the second pulsing level 312 by further adjusting the capacitance of the capacitor C4 and/or an inductance of the inductor L1.

Figure 4D:
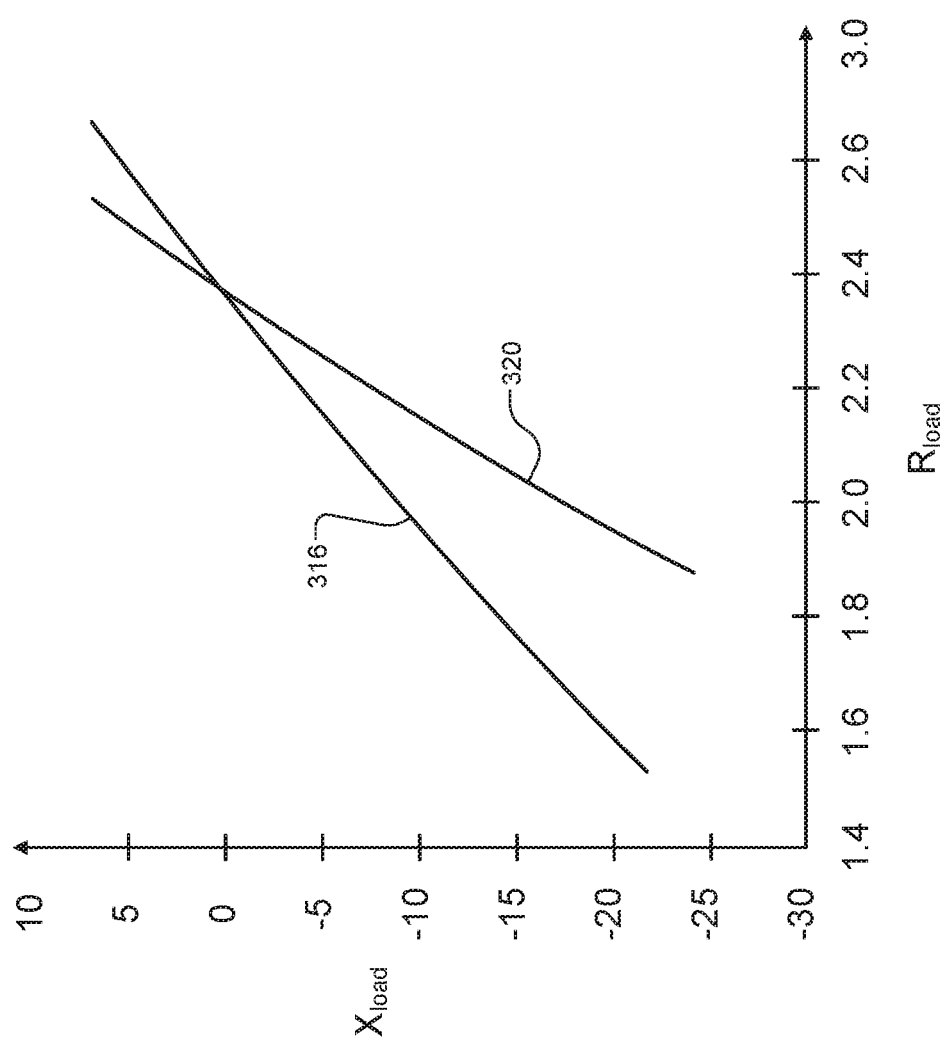
FIG. 4D shows example frequency tuning ranges for different capacitances of the matching circuit of FIGS. 4A and 4B according to the principles of the present disclosure.

As shown in FIG. 4D, an example tunable impedance range 316 for the matching circuit 300 is shown. Varying the capacitors C1 and C3 may shift the tunable impedance range 316 in a generally translational manner as described with respect to FIG. 3D. However, varying the capacitor C4 may further adjust the tunable impedance range 316 in a rotational manner. For example, increasing the capacitor C4 may result in a rotation of the tunable impedance range from 316 to 320. In other words, varying the capacitor C4 adjusts a slope of the tunable impedance range 316, allowing the matching circuit 300 to be tuned, in combination with frequency tuning, to both the first pulsing level 308 and the second pulsing level 312. In this manner, power reflection can be eliminated and/or substantially reduced for both pulsing levels. For example, when the RF power is pulsed at the first pulsing level, the RF frequency may be adjusted to a first frequency to match the impedance of the matching circuit 300 to an impedance associated with the first pulsing level. Conversely, when the RF power is pulsed at the second pulsing level, the RF frequency may be adjusted to a second frequency to match the impedance of the matching circuit 300 to an impedance associated with the second pulsing level.

In some examples, the capacitor C4 may be automatically adjusted (e.g., using the system controller 54, 160) based on a selected recipe or process. In other examples, the capacitor C4 may be manually adjusted (e.g., by a user). A range of values of the capacitor C4 may be determined according to specific substrate processing chamber characteristics.

Figure 5A:
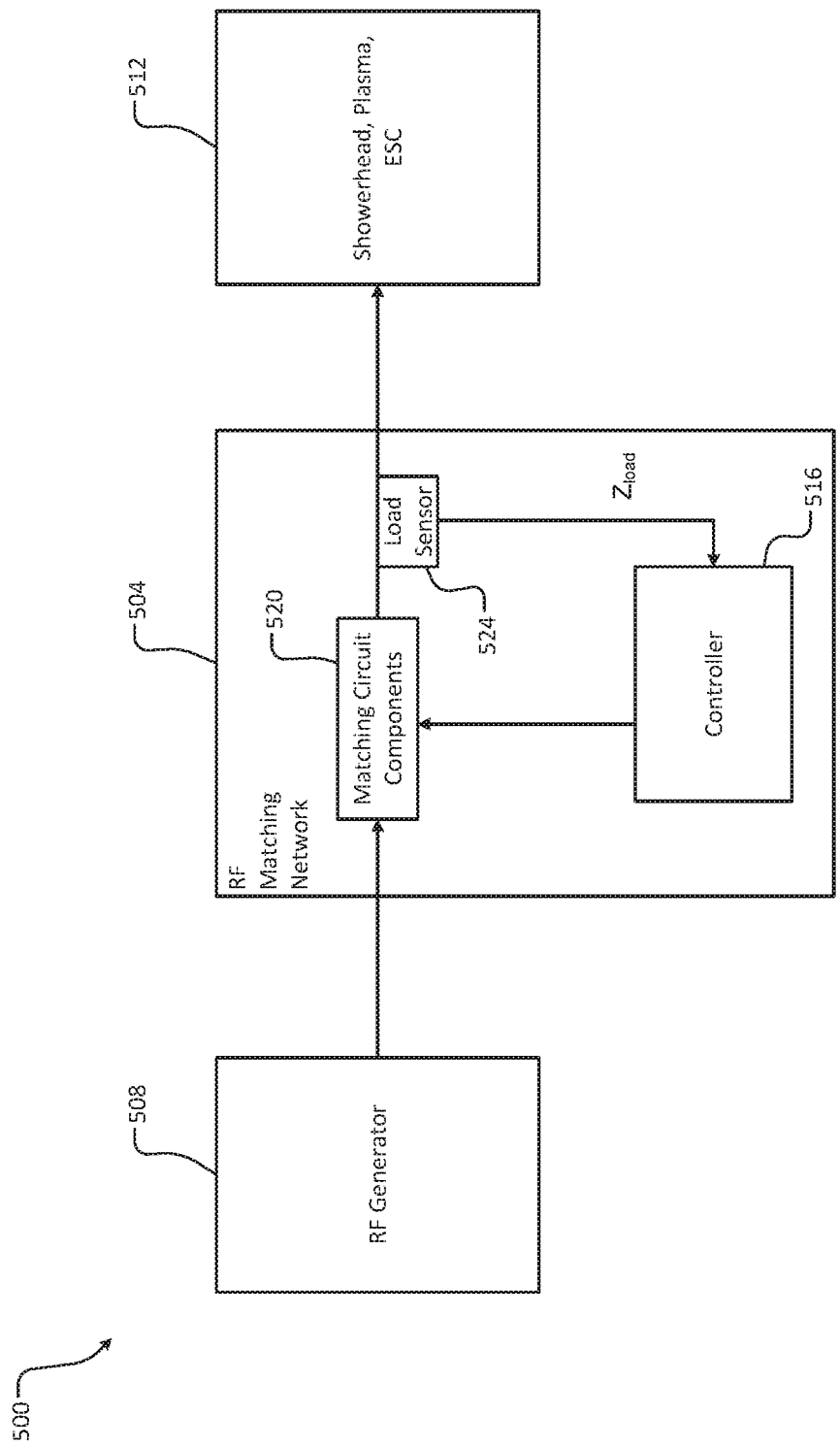
FIG. 5A shows an example matching circuit control system according to the principles of the present disclosure.

Referring now to FIGS. 5A and 5B, an example RF matching circuit control system 500 includes an RF matching network 504 configured to match an impedance $Z_{load}$ between an RF power source (e.g., RF generator 508) and, for example, an electrode (e.g., a showerhead or ESC), an inductive coil structure, plasma, etc., represented schematically at 512. The RF matching network 504 includes, and/or is responsive to, a controller 516. For example only, the RF matching network 504 may correspond to the matching network 14, 127, 129, etc. and the controller 516 may correspond to the system controller 54, 160, etc. The controller 516 is configured to adjust matching circuit components (e.g., capacitors C1, C3, C4, etc.) 520, which may correspond to the matching circuit 300, to minimize power reflection as described above in FIGS. 2-4.

For example, the controller 516 receives a sensed value corresponding to a measurement of $Z_{load}$ from a load sensor 524. As the controller 516 transitions between two or more pulsing levels of power provided by the RF generator 508 (described in the present example as two pulsing levels, such as a high pulsing level and a low pulsing level), the RF generator 508 adjusts between two frequencies (e.g., freq1 and freq2) corresponding, respectively, to the two pulsing levels. The controller 516 further adjusts capacitance values of the capacitors C1, C3, and/or C4 and/or an inductance of value of the inductor L1 based on the selected frequency and $Z_{load}$ as described below in more detail.

As shown at 528 in FIG. 5B, the controller 516 is configured to alternately transition the RF generator 508 between a high pulsing level (in a first, high pulsing period) and a low pulsing level (in a second, low pulsing period). As shown at 532, the RF generator 508 is configured to alternately transition between first and second frequencies. For example, during the high pulsing periods, the RF generator 508 adjusts to a first frequency (freq1) to match the impedance of the RF matching network 504 to an impedance associated with the high pulsing level. The first frequency may be a fixed (e.g., constant) frequency.

In some examples, the controller 516 further adjusts capacitance values of the capacitors C1 and C3 during the high pulsing periods. For example, the controller 516 may store data (e.g., a model, formula, lookup table, etc.) that correlates the measured $Z_{load}$ to values of the first frequency and the capacitors C1 and C3.

Conversely, during the low pulsing periods, the RF generator 508 adjusts the frequency to a second frequency (freq2) to match the impedance of the RF matching network 504 to an impedance associated with the low pulsing level. The second frequency may be varied in the low pulsing periods. For example, the RF generator 508 may gradually transition the frequency from the first frequency to the second frequency as shown at 536. The controller 516 further adjusts capacitance values of the capacitors C1, C3, and C4 and/or an inductance value of the inductor L1 during the low pulsing periods.

As shown at 540, by adjusting the frequency and the capacitors C1, C3, and C4 (and, in some examples, the inductor L1), reflected power may be eliminated in the high pulsing periods 544 and substantially reduced in the low pulsing periods 548. For example, further adjusting the capacitor C4 and/or the inductor L1 arranged as shown in FIGS. 4A and 4B in accordance with the measured $Z_{load}$ and the frequency of the RF generator 508 may reduce the reflected power to less than 10% in the low pulsing periods 548 as shown at 552. Conversely, reflected power in the low pulsing periods 548 may be significantly greater (e.g., 50% as shown at 556) when the RF matching network 504 does not include the capacitor C4 arranged as shown in FIGS. 4A and 4B.

Figure 6:
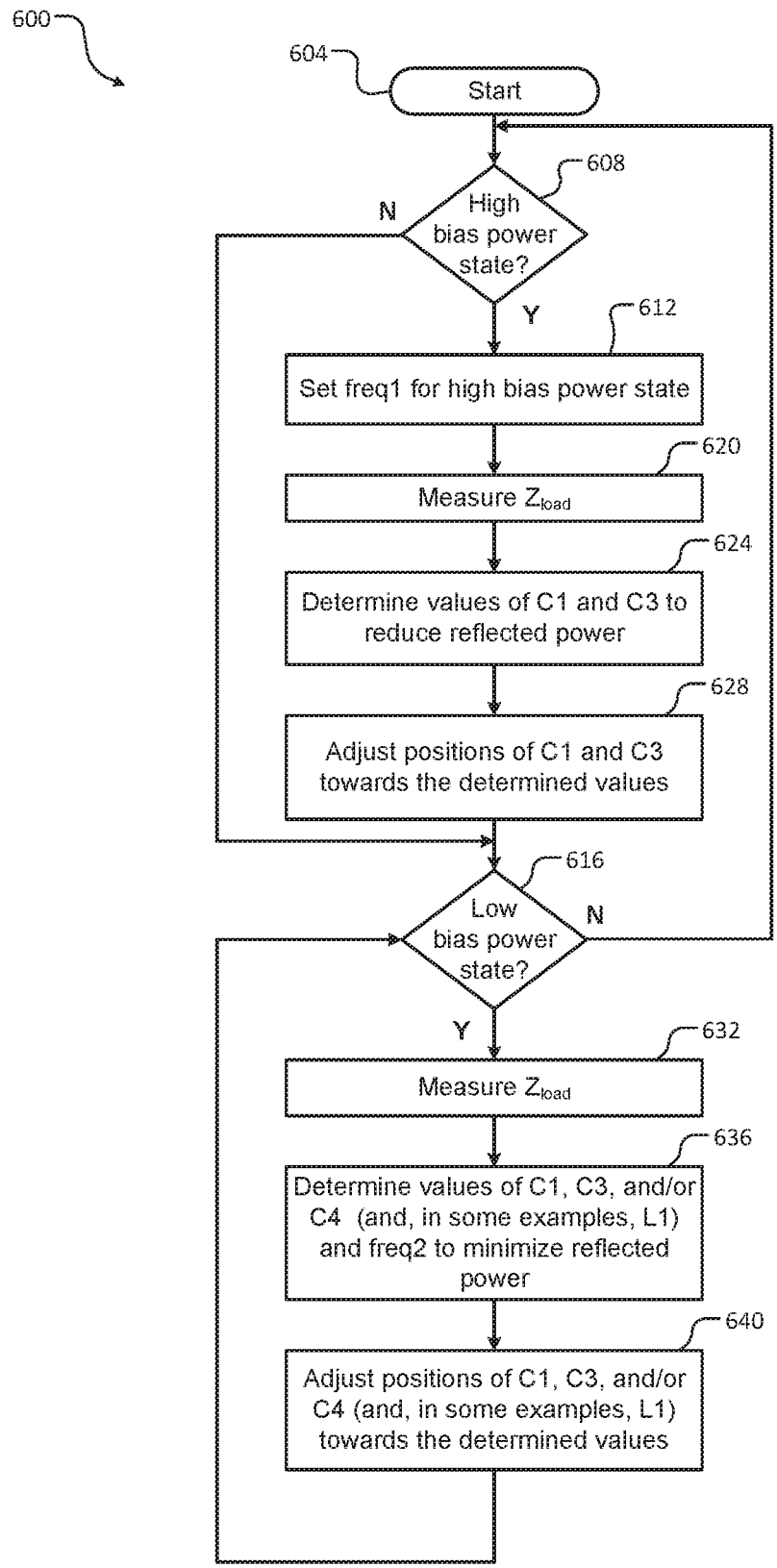
FIG. 6 shows an example method for controlling a matching circuit according to the principles of the present disclosure.

FIG. 6 shows an example method 600 (e.g., as implemented by the RF matching circuit control system 500, the controller 516, etc.) for controlling a matching circuit according to the principles of the present disclosure. The method 600 starts at 604. At 608, the method 600 determines whether the RF generator 508 is in a high bias power state (i.e., whether the RF generator 508 is providing power at a high pulsing level). If true, the method 600 continues to 612. If false, the method 600 continues to 616.

At 612, the method 600 sets a frequency of the RF generator 508 to a first frequency (e.g., freq1). At 620, the method 600 measures the impedance $Z_{load}$ (e.g., the impedance at an output of the RF matching network 504). At 624, the method 600 determines values of C1 and C3 in accordance with the first frequency and the measured $Z_{load}$ to reduce reflected power. At 628, the method 600 adjusts the values of C1 and C3. For example, the method 600 may adjust the capacitors C1 and C3 in accordance with gain factors (e.g., as stored by the controller 516) associated with adjustments to the respective capacitance values.

At 616, the method 600 determines whether the RF generator 508 is in a low bias power state (i.e., whether the RF generator 508 is providing power at a low pulsing level). If true, the method 600 continues to 632. If false, the method 600 continues to 608. At 632, the method 600 measures the impedance $Z_{load}$. At 636, the method 600 determines values of C1, C3, and C4 (and, in some examples, L1) and the second frequency freq2 in accordance with the measured $Z_{load}$ to reduce reflected power. At 640, the method 600 adjusts the values of C1, C3, C4, L1, and/or freq2. In some examples, the method 600 may incrementally adjust the values of C1, C3, C4, L1, and/or freq2 toward the determined values during the low pulsing period.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A radio frequency (RF) matching circuit control system, comprising:

an RF matching circuit including a plurality of tunable components, wherein the RF matching circuit is configured to
  receive an input signal from an RF generator, wherein the input signal includes at least two pulsing levels,
  provide an output signal to a load based on the input signal, and
  match an impedance associated with the input signal to impedances of the load; and
a controller configured to
  determine respective impedances of the load for the at least two pulsing levels of the input signal, and
  adjust operating parameters of the plurality of tunable components to align a frequency tuning range of the RF matching circuit with the respective impedances of the load for the at least two pulsing levels to match the impedance associated with the input signal to the respective impedances, wherein, to adjust the operating parameters, the controller is configured to,
  adjust, based on a first impedance determined for a first pulsing level, a first operating parameter of a first tunable component of the plurality of tunable components in response to the input signal being provided at the first pulsing level, and
  adjust, based on a second impedance determined for a second pulsing level, a second operating parameter of a second tunable component of the plurality of tunable components in response to the input signal being provided at the second pulsing level,
wherein the first operating parameter corresponds to at least one of a first capacitance of a first capacitor and a second capacitance of a second capacitor of the RE matching circuit,
wherein the second operating parameter corresponds to a third capacitance of a third capacitor, and
wherein the controller is configured to adjust, to align the frequency tuning range with both the first and second impedances, (i) the at least one of the first capacitance and the second capacitance to shift the frequency tuning range in a translational direction and (ii) the third capacitance to shift the frequency tuning range in a rotational direction to adjust a slope of the frequency tuning range.

2. The RF matching circuit control system of claim 1, wherein the first capacitor corresponds to a shunt capacitor connected between the input signal and ground.

3. The RF matching circuit control system of claim 2, wherein the second capacitor corresponds to a series capacitor connected between the input signal and the load.

4. The RF matching circuit control system of claim 3, wherein the third capacitor is connected between (i) an end of the second capacitor connected to the load and (ii) ground.

5. The RF matching circuit control system of claim 4, wherein the operating parameters further include a third operating parameter corresponding to an inductance value of an inductor.

6. The RF matching circuit control system of claim 5, wherein the inductor is connected in parallel with the third capacitor.

7. The RF matching circuit control system of claim 4, wherein, to adjust the first operating parameter, the controller is configured to (i) determine respective values of the first capacitance and the second capacitance to reduce a reflected power associated with the impedance of the load for a first pulsing level of the at least two pulsing levels and (ii) adjust at least one of the first capacitor and the second capacitor based on the determined respective values.

8. The RF matching circuit control system of claim 4, wherein, to adjust the second operating parameter, the controller is configured to (i) determine a value of the third capacitance to reduce a reflected power associated with the impedance of the load for a second pulsing level of the at least two pulsing levels and (ii) adjust the third capacitor to the determined value of the third capacitance.

9. A substrate processing system comprising the RF matching circuit control system of claim 1.

10. The RF matching circuit control system of claim 1, wherein the load corresponds to at least one of an electrode, an inductive coil structure, and plasma within a substrate processing chamber.

11. A method for performing impedance matching in a substrate processing system, the method comprising:
using an RF matching circuit including a plurality of tunable components,
receiving an input signal from an RF generator, wherein the input signal includes at least two pulsing levels,
providing an output signal to a load based on the input signal, and
matching an impedance associated with the input signal to impedances of the load;
determining respective impedances of the load for the at least two pulsing levels of the input signal; and
adjusting operating parameters of the plurality of tunable components to align a frequency tuning range of the RF matching circuit with the respective impedances of the load for the at least two pulsing levels to match the impedance associated with the input signal to the respective impedances, wherein adjusting the operating parameters includes,
adjusting, based on a first impedance determined for a first pulsing level, a first operating parameter of a first tunable component of the plurality of tunable components in response to the input signal being provided at the first pulsing level, and
adjusting, based on a second impedance determined for a second pulsing level, a second operating parameter of a second tunable component of the plurality of tunable components in response to the input signal being provided at the second pulsing level,
wherein the first operating parameter corresponds to at least one of a first capacitance of a first capacitor and a second capacitance of a second capacitor of the RF matching circuit,
wherein the second operating parameter corresponds to a third capacitance of a third capacitor, and
wherein, to align the frequency tuning range with both the first and second impedances, (i) the at least one of the first capacitance and the second capacitance are adjusted to shift the frequency tuning range in a translational direction and (ii) the third capacitance is adjusted to shift the frequency tuning range in a rotational direction to adjust a slope of the frequency tuning range.

12. The method of claim 11, wherein the first capacitor corresponds to a shunt capacitor connected between the input signal and ground.

13. The method of claim 12, wherein the second capacitor corresponds to a series capacitor connected between the input signal and the load.

14. The method of claim 13, wherein the third capacitor is connected between (i) an end of the second capacitor connected to the load and (ii) ground.

15. The method of claim 14, further comprising connecting an inductor in parallel with the third capacitor.

* * * * *